(12) United States Patent
Kuang et al.

(10) Patent No.: US 10,976,275 B2
(45) Date of Patent: Apr. 13, 2021

(54) METHOD FOR DETERMINING EFFECTIVE POROSITY OF HIGH CLAY-BEARING ROCK CORE, COMPUTER DEVICE AND COMPUTER READABLE STORAGE MEDIUM

(71) Applicant: PetroChina Company Limited, Beijing (CN)

(72) Inventors: Lichun Kuang, Beijing (CN); Dongming Zhi, Beijing (CN); Yong Song, Beijing (CN); Zhongchun Sun, Beijing (CN); Zhenlin Wang, Beijing (CN); Wei Wang, Beijing (CN); Rui Mao, Beijing (CN); Ni Zhang, Beijing (CN); Zhijun Qin, Beijing (CN); Qiusheng Chang, Beijing (CN); Haiming Wang, Beijing (CN)

(73) Assignee: PetroChina Company Limited, Beijing (CN)

( * ) Notice: Subject to any disclaimer, the term of this patent is extended or adjusted under 35 U.S.C. 154(b) by 0 days.

(21) Appl. No.: 16/729,894

(22) Filed: Dec. 30, 2019

(65) Prior Publication Data

US 2021/0072171 A1  Mar. 11, 2021

(30) Foreign Application Priority Data

Sep. 10, 2019 (CN) .......................... 201910851578.0

(51) Int. Cl.
  *G01V 3/00* (2006.01)
  *G01N 24/08* (2006.01)
  (Continued)

(52) U.S. Cl.
  CPC ............. *G01N 24/081* (2013.01); *G01N 1/30* (2013.01); *G01N 1/34* (2013.01); *G01N 1/44* (2013.01)

(58) Field of Classification Search
  None
  See application file for complete search history.

(56) References Cited

U.S. PATENT DOCUMENTS

| 5,428,291 | A | 6/1995 | Thomann et al. |
| 9,939,506 | B2 * | 4/2018 | Venkataramanan ... G01R 33/54 |
| 2006/0132131 | A1 | 6/2006 | Fleury et al. |

FOREIGN PATENT DOCUMENTS

| CN | 103674804 A | 3/2014 |
| CN | 103674811 A | 3/2014 |

(Continued)

OTHER PUBLICATIONS

Hou et al., "Porosity Computational Method Based on 2D NMR Relaxation Spectra of Leikoupo Group's 4th Section in Western Chuanxi," Chinese Journal of Magnetic Resonance, 2019.

(Continued)

*Primary Examiner* — Jyoti Nagpaul
(74) *Attorney, Agent, or Firm* — Michael Best and Friedrich LLP (57) ABSTRACT

Provided is a method for determining effective porosity of high clay-bearing rock core, comprising: acquiring a saturated sample NMR $T_2$ spectrum of a high clay-bearing rock core sample, which is measured when temperature of saturated aqueous solution reaches a preset temperature after rock core sample saturated with water being immersed into the saturated aqueous solution and placed and heated in constant temperature and humidity environment; determining a nuclear magnetic total porosity of rock core sample according to the saturated sample NMR $T_2$ spectrum; acquiring permeability and NMR $T_2$ spectrum of the rock core sample placed in the constant temperature and humidity environment and dried until different time; generating cross-plot of permeability and nuclear magnetic porosity; determining first porosity and second porosity; and determining (Continued)

an effective porosity of the h rock core based on the first porosity, the second porosity, and the nuclear magnetic total porosity.

20 Claims, 5 Drawing Sheets

(51) Int. Cl.
  *G01N 1/30* (2006.01)
  *G01N 1/34* (2006.01)
  *G01N 1/44* (2006.01)

(56) References Cited

FOREIGN PATENT DOCUMENTS

| | | |
|---|---|---|
| CN | 103760082 A | 4/2014 |
| CN | 104237957 A | 12/2014 |
| CN | 104594888 A | 5/2015 |
| CN | 105866009 A | 8/2016 |
| CN | 106837318 A | 6/2017 |
| CN | 107271347 A | 10/2017 |
| CN | 107605468 A | 1/2018 |
| CN | 107843937 A | 3/2018 |
| CN | 110031496 A | 7/2019 |
| EP | 3183422 A1 | 12/2017 |
| WO | 2016/076860 A1 | 5/2016 |

OTHER PUBLICATIONS

Wang et al., "Determination of the starting time for measurement of NMR effective porosity in shale oil reservoir a case study of the Permian Lucaogou shale oil reservoir Jimusaer sag," Oil & Gas Geology, vol. 40, No. 3, 2019.
Practices for core analysis SY/T 5336-2006 (2006).
Practices for core analysis GB/T29172-2012 (2012).
Chinese Patent Office Decision to Grant Application No. 201910851578.0 dated Jun. 4, 2020 (3 pages, English translation included).
Chinese Patent Office Supplementary Search for Application No. 201910851578.0 dated May 11, 2020 (4 pages, English translation included).
Yao Yanbin et al., "Petrophysical properties and fluids transportation in gas shale: A NMR relaxation spectrum analysis method," Journal of China Coal Society, Jan. 2018, vol. 43, No. 1, pp. 181-189.
SI Maliqiang et al., "Method for determining effective thickness of tight sandstone reservoir," Petroleum Geology and Recovery Efficiency, Sep. 2014, vol. 21, No. 5, pp. 57-60.
Zhu et al., "NMR Logging Permeability Prediction Method Based on Dynamic Pore Structure Efficiency," Xinjiang Petroleum Geology, Oct. 2015, vol. 36, No. 5, pp. 607-611.
Chinese Patent Office Action and Search Report for Application No. 201910851578.0 dated Apr. 22, 2020 (13 pages, English translation included).

* cited by examiner

METHOD FOR DETERMINING EFFECTIVE POROSITY OF HIGH CLAY-BEARING ROCK CORE, COMPUTER DEVICE AND COMPUTER READABLE STORAGE MEDIUM

CROSS REFERENCE TO RELATED APPLICATIONS

This application claims priority from Chinese Application Number 201910851578.0, entitled "Method and device for determining an effective porosity of a high clay-bearing rock core", filed on Sep. 10, 2019, the subject matter of which is incorporated herein by reference.

TECHNICAL FIELD

The present invention relates to the technical field of petroleum and natural gas geology and exploration and development, in particular to a method for determining an effective porosity of a high clay-bearing rock core, a computer device and a computer readable storage medium.

BACKGROUND

For a high clay-bearing rock, fluids in the rock include a movable fluid, a capillary bound fluid and a clay bound fluid, respectively corresponding to a movable fluid porosity, a capillary bound fluid porosity and a clay bound fluid porosity. The sum of these three fluid porosities is a total porosity, and the sum of the movable fluid porosity and the capillary bound fluid porosity is called an effective porosity.

The existing methods for determining an effective porosity of a high clay-bearing rock core (a rock core with clay content greater than 5%) mainly include a fluid (usually kerosene) saturation weighing method, a helium injection porosity method, a nuclear magnetic resonance (NMR) method, etc. Due to influence of uncertain factors such as temperature, humidity, time and etc., these methods lead to a clay-adsorbed water loss, resulting in relatively large measurement results of the effective porosity.

Regarding the above technical problem, no effective solution has been proposed yet.

SUMMARY

Embodiments of the present invention provide a method for determining an effective porosity of a high clay-bearing rock core, to improve the accuracy of determining the effective porosity of the highly clay-bearing rock core, the method comprising:

acquiring a saturated sample nuclear magnetic resonance (NMR) $T_2$ spectrum of a high clay-bearing rock core sample, wherein the saturated sample NMR $T_2$ spectrum is measured when a temperature of saturated aqueous solution reaches a preset temperature after the high clay-bearing rock core sample saturated with water being immersed into the saturated aqueous solution and then being placed and heated in a constant temperature and humidity environment;

determining a nuclear magnetic total porosity of the high clay-bearing rock core sample according to the saturated sample NMR $T_2$ spectrum;

acquiring a permeability and an NMR $T_2$ spectrum of the high clay-bearing rock core sample that is placed in the constant temperature and humidity environment and dried until different time;

generating a cross-plot of a permeability and a nuclear magnetic porosity according to the permeability and the NMR $T_2$ spectrum at different time;

determining, according to the cross-plot, a first porosity corresponding to that the permeability reaches a first inflection point and a second porosity corresponding to that the permeability reaches a second inflection point; and determining an effective porosity of the high clay-bearing rock core based on the first porosity, the second porosity, and the nuclear magnetic total porosity.

The embodiments of the present invention further provide a computer device for improving the accuracy of determining the effective porosity of the highly clay-bearing rock core, and the computer device comprises: a processor and a memory including a computer readable instruction, when being executed, the computer readable instruction causes the processor to execute the following operations:

acquiring a saturated sample nuclear magnetic resonance (NMR) $T_2$ spectrum of a high clay-bearing rock core sample, wherein the saturated sample NMR $T_2$ spectrum is measured when a temperature of saturated aqueous solution reaches a preset temperature after the high clay-bearing rock core sample saturated with water being immersed into the saturated aqueous solution and then being placed and heated in a constant temperature and humidity environment;

determining a nuclear magnetic total porosity of the high clay-bearing rock core sample according to the saturated sample NMR $T_2$ spectrum;

acquiring a permeability and an NMR $T_2$ spectrum of the high clay-bearing rock core sample that is placed in the constant temperature and humidity environment and dried until different time;

generating a cross-plot of a permeability and a nuclear magnetic porosity according to the permeability and the NMR $T_2$ spectrum at different time;

determining, according to the cross-plot, a first porosity corresponding to that the permeability reaches a first inflection point and a second porosity corresponding to that the permeability reaches a second inflection point; and determining an effective porosity of the high clay-bearing rock core based on the first porosity, the second porosity, and the nuclear magnetic total porosity.

The embodiments of the present invention further provide a computer readable storage medium including a computer readable instruction, to improve the accuracy of determining the effective porosity of the highly clay-bearing rock core, when being executed, the computer readable instruction causes a processor to execute at least the following operations:

acquiring a saturated sample nuclear magnetic resonance (NMR) $T_2$ spectrum of a high clay-bearing rock core sample, wherein the saturated sample NMR $T_2$ spectrum is measured when a temperature of saturated aqueous solution reaches a preset temperature after the high clay-bearing rock core sample saturated with water being immersed into the saturated aqueous solution and then being placed and heated in a constant temperature and humidity environment;

determining a nuclear magnetic total porosity of the high clay-bearing rock core sample according to the saturated sample NMR $T_2$ spectrum;

acquiring a permeability and an NMR $T_2$ spectrum of the high clay-bearing rock core sample that is placed in the constant temperature and humidity environment and dried until different time;

generating a cross-plot of a permeability and a nuclear magnetic porosity according to the permeability and the NMR $T_2$ spectrum at different time;

determining, according to the cross-plot, a first porosity corresponding to that the permeability reaches a first inflection point and a second porosity corresponding to that the permeability reaches a second inflection point; and determining an effective porosity of the high clay-bearing rock core based on the first porosity, the second porosity, and the nuclear magnetic total porosity.

In comparison with the solution in the existing methods for determining an effective porosity of a high clay-bearing rock core that, due to influence of uncertain factors such as temperature, humidity and time and etc., these methods lead to clay adsorbed water loss, thereby resulting in relatively large measurement results of the effective porosity, the technical solution provided by the embodiments of the present invention specifically comprises: firstly, acquiring a saturated sample NMR $T_2$ spectrum of a high clay-bearing rock core sample, wherein the saturated sample NMR $T_2$ spectrum is measured when temperature of saturated aqueous solution reaches a preset temperature after the high clay-bearing rock core sample with saturated water being immersed into the saturated aqueous solution and then being placed and heated under a constant temperature and humidity environment; secondly, determining a nuclear magnetic total porosity of the rock core sample according to the saturated sample NMR $T_2$ spectrum; next, acquiring permeability and a NMR $T_2$ spectrum of a saturated rock core sample which is placed in the constant temperature and humidity environment and dried until different time; then, generating a cross-plot of permeability and nuclear magnetic porosity according to the permeability and the NMR $T_2$ spectrum at different time; determining a first porosity corresponding to the permeability when it reaches a first inflection point and a second porosity corresponding to the permeability when it reaches a second inflection point according to the cross-plot; finally, determining an effective porosity of the high clay-bearing rock core based on the first porosity, the second porosity, and the nuclear magnetic total porosity, which achieves that: the first porosity and the second porosity can be determined based on the permeability and the NMR $T_2$ spectrum at different time in a constant temperature and humidity condition, wherein the first porosity and the second porosity are porosities before the clay adsorbed water is lost; and the effective porosity of the high clay-bearing rock core is determined as an effective porosity without loss of the clay adsorbed water, based on the first porosity, the second porosity and the nuclear magnetic total porosity, thereby improving the accuracy of determining the effective porosity of the highly clay-bearing rock core.

BRIEF DESCRIPTION OF THE DRAWINGS

In order to more clearly explain the technical solution in the embodiments of the invention or in the prior art, drawings that need to be used in the description in embodiments or the prior art will be simply introduced below. Apparently, the drawings in the following description are merely some examples of the invention, it is also possible for persons ordinarily skilled in the art to obtain other drawings according to these drawings without making creative efforts.

DETAILED DESCRIPTION OF EMBODIMENTS

Hereinafter the technical solution in the embodiments of the present invention will be described clearly and integrally in combination with the accompanying drawings in the embodiments of the present invention, and obviously the described embodiments are merely part of the embodiments, not all of the embodiments. Based on the embodiments of the present invention, all other embodiments that are obtained by persons skilled in the art without making creative efforts fall within the protection scope of the present invention.

After a long period of extensive research, the inventor has found that there is a technical problem that measurement results of the effective porosity obtained by the existing methods for measuring an effective porosity of a high clay-bearing rock core are relatively large. The existing methods all comprise: firstly drying a rock sample with washing oil saturated water at a certain temperature, in different ways for sandstones with different clay contents, e.g.: 1. for the sandstone with a low clay content, dried in a conventional oven or a vacuum oven at a temperature of 90° C.~116° C.; 2. for the sandstone with a high clay content, dried in a controllable dry humidity oven at a relative humidity of 40% and a temperature of 63° C., where each rock sample is dried until it reaches a constant weight, and the drying time is different, generally exceeding 4 hours (according to the Core Analysis Method (SY/T 5336-2006, GB/T29172-2012)). A high clay-bearing conglomerate reservoir is characterized in high clay bound water, and the effective porosity measurement applied by the existing methods will result in relatively large effective porosity measurement results, which are mainly due to: (1) too high drying temperature; (2) no proper drying humidity has been determined; and (3) the drying time is uncertain and too long. These factors lead to the loss of clay adsorbed water during the drying process of rock samples, resulting in relatively large effective porosity measurement results of the high clay-bearing conglomerate.

In view of the above technical problems found by the inventor, a solution for determining an effective porosity of a high clay-bearing rock core based on nuclear magnetic resonance and permeability measurement under a constant temperature and humidity condition is provided. The solution comprises: drying the sample under a constant temperature and humidity condition; measuring a nuclear magnetic $T_2$ spectrum and a permeability at different drying time; dynamically monitoring whether the clay adsorbed water is lost during the drying process by measuring a NMR $T_2$ spectrum; determining a movable fluid porosity, a capillary bound fluid porosity and a clay bound fluid porosity under a constant temperature and humidity condition by utilizing the measured air permeability and the nuclear magnetic porosity cross-plot calculated from the $T_2$ spectrum, so as to determine the effective porosity. The solution is a solution for measuring the porosity while ensuring that the clay adsorbed water is not lost, and effectively solves the technical problem of a large error in the existing measurement technology for measuring a porosity of a high clay-bearing rock core. The solution for determining an effective porosity of a high clay-bearing rock core is described in detail below.

Figure 1:
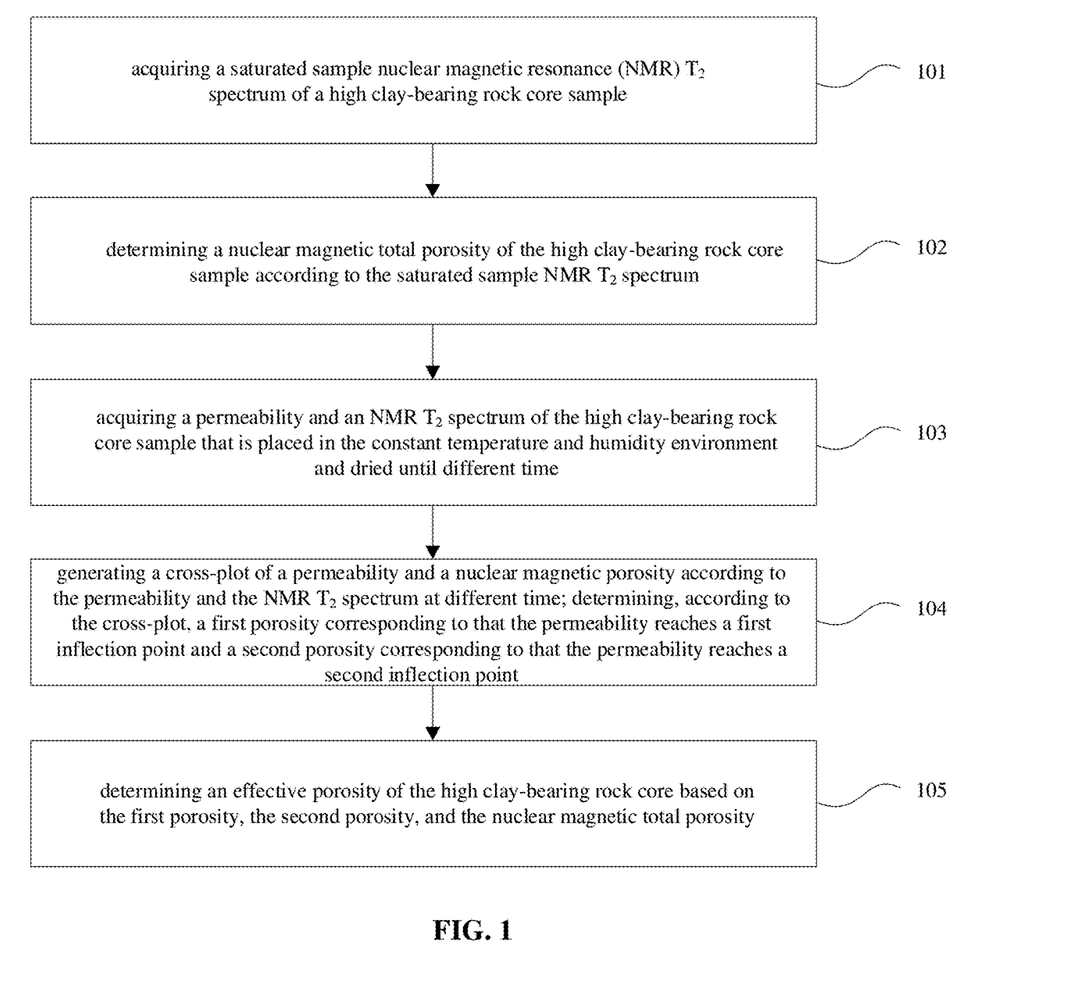
FIG. 1 is a schematic diagram illustrating a flow of a method for determining an effective porosity of a high clay-bearing rock core according to an embodiment of the present invention.

FIG. 1 is a schematic diagram illustrating a flow of a method for determining an effective porosity of a high clay-bearing rock core according to an embodiment of the present invention. As shown in FIG. 1, the method comprises the following steps.

Step 101: acquiring a saturated sample nuclear magnetic resonance (NMR) $T_2$ spectrum of a high clay-bearing rock core sample, wherein the saturated sample NMR $T_2$ spectrum is measured when a temperature of saturated aqueous solution reaches a preset temperature after the high clay-bearing rock core sample saturated with water being immersed into the saturated aqueous solution and then being placed and heated in a constant temperature and humidity environment.

Step 102: determining a nuclear magnetic total porosity of the high clay-bearing rock core sample according to the saturated sample NMR $T_2$ spectrum.

Step 103: acquiring a permeability and an NMR $T_2$ spectrum of the high clay-bearing rock core sample that is placed in the constant temperature and humidity environment and dried until different time.

Step 104: generating a cross-plot of a permeability and a nuclear magnetic porosity according to the permeability and the NMR $T_2$ spectrum at different time; determining, according to the cross-plot, a first porosity corresponding to that the permeability reaches a first inflection point and a second porosity corresponding to that the permeability reaches a second inflection point.

Step 105: determining an effective porosity of the high clay-bearing rock core based on the first porosity, the second porosity, and the nuclear magnetic total porosity.

In comparison with the solution in the existing methods for determining an effective porosity of a high clay-bearing rock core that, due to influence of uncertain factors such as temperature, humidity and time and etc., these methods lead to clay adsorbed water loss, thereby resulting in relatively large measurement results of the effective porosity. The technical solution provided by the embodiments of the present invention achieves that: the first porosity and the second porosity can be determined based on the permeability and the NMR $T_2$ spectrum at different time under a constant temperature and humidity condition, wherein the first porosity and the second porosity are porosities before the clay adsorbed water is lost; and the effective porosity of the high clay-bearing rock core is determined as an effective porosity without loss of the clay adsorbed water, based on the first porosity, the second porosity and the nuclear magnetic total porosity, thereby improving the accuracy of determining the effective porosity of the highly clay-bearing rock core.

Figure 2:
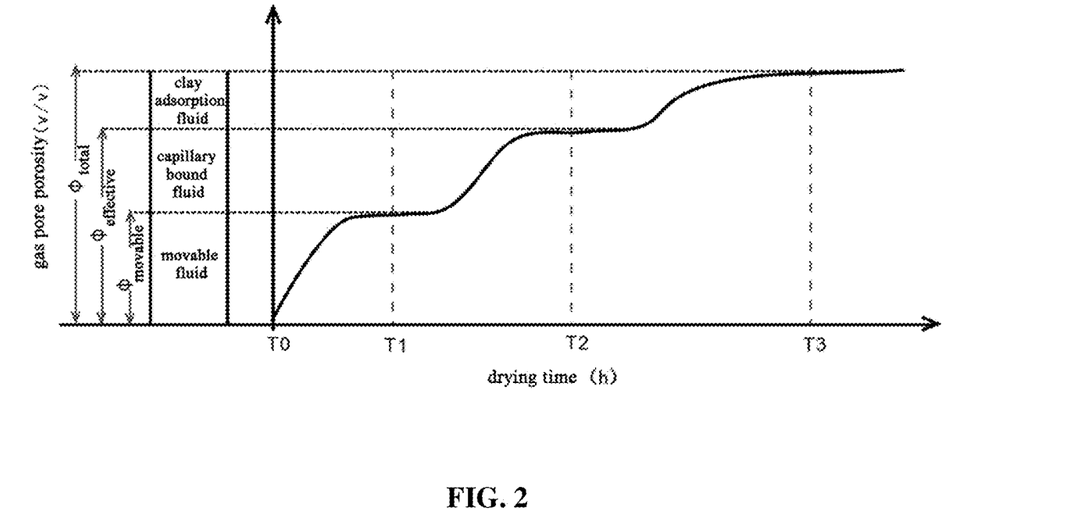
FIG. 2 is a schematic diagram illustrating a principle of a method for determining an effective porosity of a high clay-bearing rock core according to an embodiment of the present invention.
Figure 3:
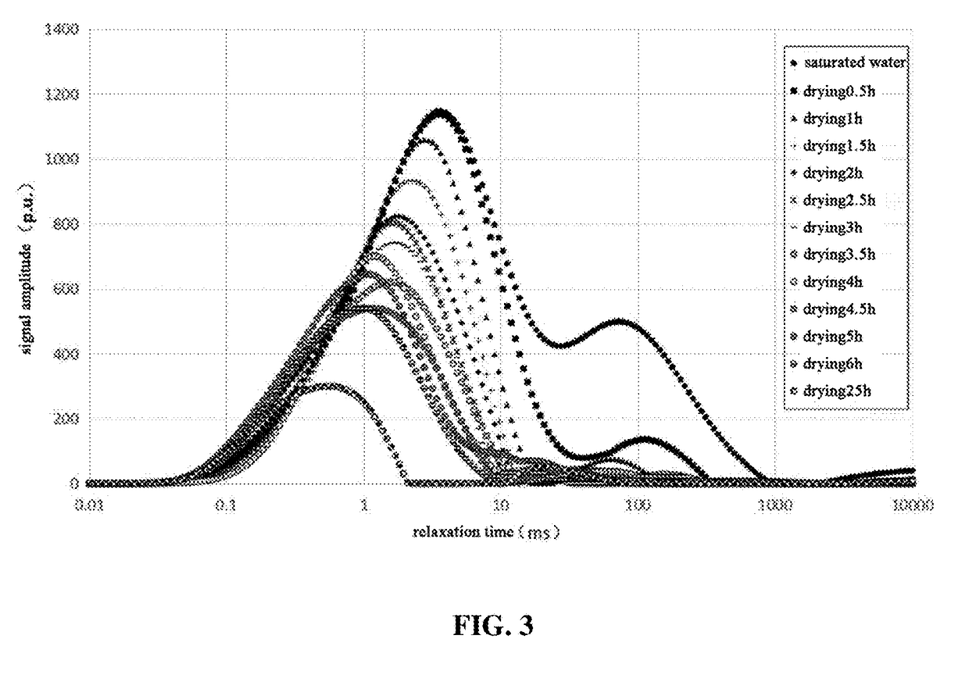
FIG. 3 is a schematic diagram illustrating that the NMR $T_2$ spectrum of a sample changes with drying time under a constant temperature and humidity condition according to an embodiment of the present invention.

The steps involved in the embodiments of the present invention will be described in detail with reference to FIG. 2 to FIG. 4.

Before describing the steps involved in the embodiments of the present invention, in order to facilitate understanding of the implementation of the present invention, the principle of the technical solution provided by the embodiments of the present invention is described at first. FIG. 2 is a schematic diagram illustrating principle of a method for determining an effective porosity of a high clay-bearing rock core according to an embodiment of the present invention. As shown in FIG. 2, when a saturated brine core is dried, the movable fluid is dried at first. After the movable fluid is dried, since the pore space of the capillary bound fluid is narrower than the pore space of the movable fluid, it is more difficult to dry the capillary bound fluid under the same drying condition, thus the measurement curve enters a first platform (a time period that will reach the time T1). With the increase of the drying time, the capillary bound fluid is dried gradually. If the drying is continued after the capillary bound fluid is dried, the clay adsorbed fluid may be dried, causing the effective porosity measurement error to become large. Therefore, it is necessary to perform nuclear magnetic and permeability co-measurement to monitor the drying time reaches time T2, that is, it is necessary to co-measure the first porosity and the second porosity before the clay adsorbed water is not lost by nuclear magnetic and permeability co-measurement.

Next, the principle is described that spectral shape change of the NMR $T_2$ spectrum can be used to ensure that the first porosity and the second porosity are the porosities before the clay adsorbed water is not lost, that is, the NMR $T_2$ spectrum is measured, to dynamically monitor whether the clay adsorbed water is lost during drying the rock. FIG. 3 is a schematic diagram illustrating that the NMR $T_2$ spectrum of a sample changes with drying time in a constant temperature and humidity condition according to an embodiment of the present invention. It can be seen from FIG. 3 that the spectral shape of the saturated brine rock sample is the largest (labeled as "saturation-0"). With the increase of the drying time, the spectral shape of the nuclear magnetic $T_2$ spectrum becomes smaller and smaller, and the amplitude of decreasing becomes smaller and smaller. The variation of amplitude of the $T_2$ spectrum at a drying time of 5 hours (labeled "5 h") to 6 hours (labeled "6 h") has been very small. When it is dried for 25 hours (label "25 h"), the nuclear magnetic $T_2$ spectrum has been the smallest, and it is analyzed that the clay adsorbed fluid has been lost.

Based on the statements above with respect to FIGS. 2 and 3, the steps are described in detail below.

I. Firstly, the steps preceding to determining an effective porosity of a high clay-bearing rock core are introduced.

1. Sample Selection and Processing

In an embodiment, a high clay-bearing rock core sample is a plunger core sample having a diameter ranging from 25 mm to 26 mm; and an included angle between an end face and an axial face of the high clay-bearing rock core sample ranges from 88 degrees to 92 degrees.

In a specific implementation, the plunger core sample with a diameter ranging from 25 mm to 26 mm (preferably 25.4 mm) and the high clay-bearing rock core sample with an included angle between the end face and the axial surface ranging from 88 degrees to 92 degrees (preferably 90 degrees) are helpful to improve the accuracy of determining the effective porosity of the highly clay-bearing rock core.

In a specific implementation, a diamond sand line lithologic cut machine is used for processing a high clay-bearing sample to a plunger sample with a conventional diameter of 25.4 mm that is used in the experiment. No special processing is required for the sample, but the end face of the sample should be straight, and the included angle between the end face of the sample and the axial face of the sample should be close to 90°. The sample length can be 25 mm 50 mm. Totally 12 high clay-bearing conglomerate experiment samples can be sampled. The sample may be a closed coring sample or a conventional coring sample. No special preservation of the sample is required, and evaporation of the sample fluid does not affect the measurement results.

2. Pretreatment Operation for High Clay-Bearing Rock Core Sample

In an embodiment, before the high clay-bearing rock core sample is immersed into the saturated aqueous solution, the following pretreatment operations may be performed on the high clay-bearing rock core sample:

performing an oil washing operation on the high clay-bearing rock core sample by using an organic solvent;

saturating the high clay-bearing rock core sample that has been subjected to the oil washing operation with brine.

In a specific implementation, it is necessary to wash oil and then saturate water before starting the experiment. The processed sample needs to be oil-washed with an organic solvent at first, and then to be saturated with the high salinity brine, thereby avoiding damage to the sample due to water swelling of clay in the rock core, and ensuring the safe and efficient measurement.

II. Secondly, the above step 101 is described.

In an embodiment, the saturated sample NMR $T_2$ spectrum may be measured when a temperature of saturated solution reaches any temperature between 55° C. and 65° C. after the high clay-bearing rock core sample being immersed into the saturated solution and then being placed and heated in a constant temperature and humidity environment.

In a specific implementation, the saturated sample NMR $T_2$ spectrum that is measured when a temperature of saturated solution reaches any temperature between 55° C. and 65° C. (preferably 60° C.) is helpful to improve the accuracy of determining the effective porosity of the highly clay-bearing rock core.

In an embodiment, the saturated sample NMR $T_2$ spectrum may be measured when a temperature of saturated solution reaches 60° C. after the high clay-bearing rock core sample being immersed into the saturated solution and then being placed and heated in a constant temperature and humidity environment.

In a specific implementation, 55° C. is the lower limit of the drying temperature, 65° C. is the upper limit of the drying temperature, and drying the sample within this range can achieve the purpose of not losing the adsorbed water. However, the measurement time at 55° C. is long and the aging time is too low, while the drying time at 65° C. is relatively shortened, but a faster drying will cause that the permeability and porosity measurement cannot "catch" the inflection point (point at which the permeability suddenly changes). After many experiments, it is proved that 60° C. is a suitable drying temperature.

In a specific implementation, after that saturation of brine is completed, the sample may be immersed in the saturated solution, and placed and heated in a constant temperature and humidity oven until the temperature of the saturated solution reaches 60° C., so as to measure the saturated sample NMR $T_2$ spectrum.

In a specific implementation, "saturation of high clay-bearing rock core" means that the pore space in the core has already been in a fluid-free state after oil washing, and the pore space of the core is refilled with brine until no brine can enter the pore space, and the core sample at this time is referred to as a "saturated core". The "brine" here may be the pure water, or formation water (brine with a certain salinity) provided at the oilfield site, or may not necessarily be a saturated solution.

III. Next, the above step 102 is described.

Figure 4:
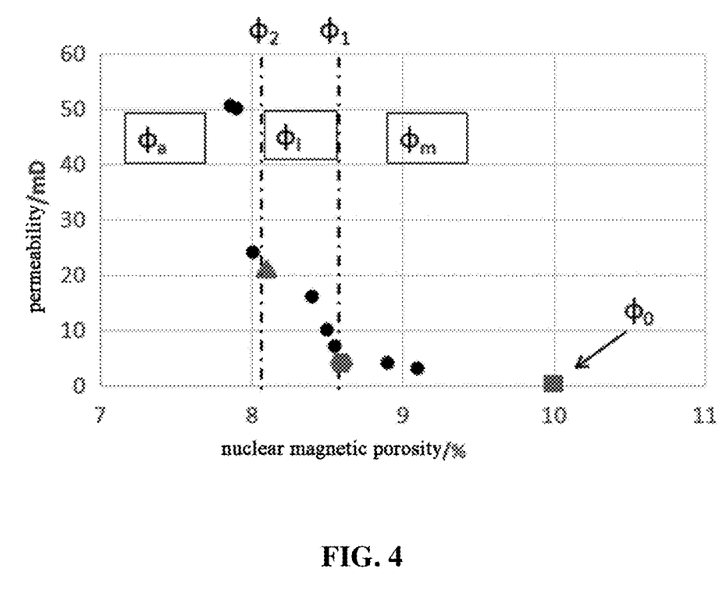
FIG. 4 is a schematic diagram of a cross-plot of a permeability and a nuclear magnetic porosity according to an embodiment of the present invention.

In a specific implementation, when the drying starts, the core sample (rock sample) is in the state of saturated brine, and the gas cannot enter into the pore space of the rock sample, so the gas permeability is 0, and the measured porosity is the nuclear magnetic total porosity, as $\Phi_0$ shown in FIG. 4.

IV. Next, the above step 103 is described.

In an embodiment, said acquiring a permeability and an NMR $T_2$ spectrum of a saturated rock core sample that is placed in the constant temperature and humidity environment and dried until different time, may include:

acquiring, when a saturated rock core sample is placed in the constant temperature and humidity environment, a permeability and an NMR $T_2$ spectrum of the saturated rock core sample that are measured every 0.5 hours when the NMR $T_2$ spectrum reflects a movable fluid; and a permeability and a NMR $T_2$ spectrum of the saturated rock core sample that are measured every 1 hour when the NMR $T_2$ spectrum does not reflect a movable fluid and reflects a bound fluid.

In a specific implementation, after the temperature of the saturated solution reaches 60° C. and the saturated sample NMR $T_2$ spectrum is measured, the sample is taken out of the saturated solution and put into an oven for drying.

In a specific implementation, after the temperature of the saturated solution reaches 60° C. and the saturated sample NMR $T_2$ spectrum is measured, the saturated sample is taken out of the saturated solution and is put into a constant temperature and humidity oven, and the air permeability Ki and the NMR $T_2$ spectrum are measured once every 0.5 h drying of the saturated sample. When the drying proceeds to the time when the NMR $T_2$ spectrum reflects only clay bound water (the $T_2$ spectral shape, labeled "6 h", in FIG. 3), the measurement is performed once every 1 h until the sample is dried to reach a constant weight (time T3 in FIG. 2). After a large number of experimental studies, the inventor has found that the permeability and a NMR $T_2$ spectrum of the saturated rock core sample that are measured every 0.5 hours when the NMR $T_2$ spectrum reflects the movable fluid, and the permeability and a NMR $T_2$ spectrum of the saturated rock core sample that are measured every 1 hour when the NMR $T_2$ spectrum does not reflect the movable fluid and reflects the bound water, are helpful to improve the efficiency and accuracy of determining the effective porosity of the highly clay-bearing rock core.

V. Next, the above step 104 is described.

In a specific implementation, the first porosity and the second porosity are determined by using the cross-plot (as shown in FIG. 4), which is convenient and fast, and has high efficiency and precision.

In a specific implementation, FIG. 4 is a schematic diagram of a cross-plot of a permeability and a nuclear magnetic porosity according to an embodiment of the present invention, i.e., a cross-plot of a nuclear magnetic porosity and a permeability under a constant temperature and humidity condition. As shown in FIG. 4, when the drying starts, the rock sample is in a state of saturated brine, and gas cannot enter the pore space of the rock sample, thus the gas permeability is 0, and the measured porosity is the total porosity (square, $\Phi_0$). As the drying time increases, the fluid in the rock sample is dried gradually, the pore space of the rock sample that the gas can enter into becomes larger, and the gas permeability increases. When the gas permeability enters the first inflection point (first inflection point, hexagon, $\Phi_1$), it indicates that the movable fluid has been dried; when the gas permeability enters the second inflection point (second inflection point, triangle, $\varphi_2$), it indicates that the capillary bound fluid has been dried.

VI. Finally, the above step 105 is described.

In an embodiment, said determining an effective porosity of the high clay-bearing rock core based on the first porosity, the second porosity, and the nuclear magnetic total porosity, may include:

determining a movable fluid porosity according to the nuclear magnetic total porosity and the first porosity;

determining a bound fluid porosity according to the first porosity and the second porosity; and determining the effective porosity of the high clay-bearing rock core according to the movable fluid porosity and the bound fluid porosity.

In a specific implementation, according to the measured permeability and the nuclear magnetic porosity calculated from the NMR $T_2$ spectrum, a cross-plot of the permeability and the nuclear magnetic porosity is drawn (FIG. 4), and according to the nuclear magnetic porosities $\Phi_1$ and $\Phi_2$ that correspond to the two inflection points in the cross-plot and the nuclear magnetic total porosity $\Phi_0$ in the saturated state, the movable fluid porosity $\Phi_m$, the bound fluid porosity $\varphi_i$ and the effective porosity $\Phi_e$ of the rock core can be determined as follows:

$$\Phi_m = \Phi_0 - \Phi_1;$$

Therefore, $\Phi_e = \Phi_m + \Phi_i$.

In a specific implementation, the embodiments of the present invention may also determine the clay adsorbed fluid porosity $\Phi_a$, and the adsorbed fluid porosity $\Phi_a = \Phi_0 - \Phi_2$.

In a specific implementation, the core sample mentioned in the embodiment of the present invention is sampled in Mahu area of Junggar basin, and the sample is Sample No. 1 selected from a batch of core samples of high clay-bearing conglomerate. After a lot of practice verifications, the technical solution provided by the embodiments of the present invention has high accuracy in determining an effective porosity.

Figure 5:
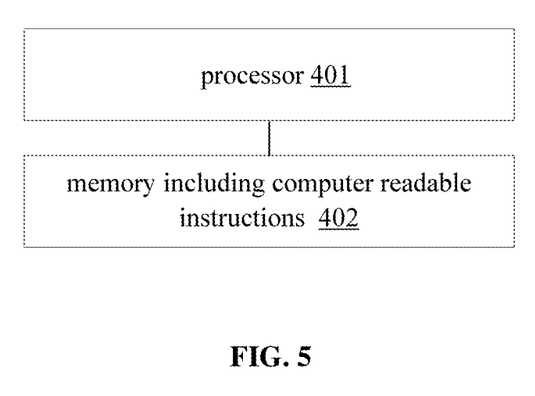
FIG. 5 is a structural block diagram of a computer device according to an embodiment of the invention.

An embodiment of the present invention further provides a computer equipment, as shown in FIG. 5, the computer equipment comprises: a processor 401 and a memory 402 including computer readable instructions, wherein the memory 402 is coupled to the processor 401, when being executed, the computer readable instructions cause the processor to execute the following operations:

acquiring a saturated sample nuclear magnetic resonance (NMR) $T_2$ spectrum of a high clay-bearing rock core sample, wherein the saturated sample NMR $T_2$ spectrum is measured when a temperature of saturated aqueous solution reaches a preset temperature after the high clay-bearing rock core sample saturated with water being immersed into the saturated aqueous solution and then being placed and heated in a constant temperature and humidity environment;

determining a nuclear magnetic total porosity of the high clay-bearing rock core sample according to the saturated sample NMR $T_2$ spectrum;

acquiring a permeability and an NMR $T_2$ spectrum of the high clay-bearing rock core sample that is placed in the constant temperature and humidity environment and dried until different time;

generating a cross-plot of a permeability and a nuclear magnetic porosity according to the permeability and the NMR $T_2$ spectrum at different time;

determining, according to the cross-plot, a first porosity corresponding to that the permeability reaches a first inflection point and a second porosity corresponding to that the permeability reaches a second inflection point; and determining an effective porosity of the high clay-bearing rock core based on the first porosity, the second porosity, and the nuclear magnetic total porosity.

In an embodiment, said acquiring a permeability and an NMR $T_2$ spectrum of the high clay-bearing rock core sample that is placed in the constant temperature and humidity environment and dried until different time comprises:

acquiring, when a saturated rock core sample is placed in the constant temperature and humidity environment, a permeability and an NMR $T_2$ spectrum of the saturated rock core sample that are measured every 0.5 hours when the NMR $T_2$ spectrum reflects a movable fluid; and a permeability and a NMR $T_2$ spectrum of the saturated rock core sample that are measured every 1 hour when the NMR $T_2$ spectrum does not reflect a movable fluid and reflects a bound water.

In an embodiment, said determining an effective porosity of the high clay-bearing rock core based on the first porosity, the second porosity, and the nuclear magnetic total porosity comprises:

determining a movable fluid porosity according to the nuclear magnetic total porosity and the first porosity;

determining a bound fluid porosity according to the first porosity and the second porosity; and determining the effective porosity of the high clay-bearing rock core according to the movable fluid porosity and the bound fluid porosity.

In an embodiment, the saturated sample NMR $T_2$ spectrum may be measured when a temperature of a saturated brine solution reaches any temperature between 55° C. and 65° C. after the high clay-bearing rock core sample being immersed into the saturated brine solution and then being placed and heated in the constant temperature and humidity environment.

In an embodiment, the saturated sample NMR $T_2$ spectrum is measured when a temperature of a saturated brine solution reaches 60° C. after the high clay-bearing rock core sample being immersed into the saturated brine solution and then being placed and heated in the constant temperature and humidity environment.

In an embodiment, the high clay-bearing rock core sample is a plunger core sample having a diameter ranging from 25 mm to 26 mm; and an included angle between an end face and an axial face of the high clay-bearing rock core sample ranges from 88 degrees to 92 degrees.

In an embodiment, before the high clay-bearing rock core sample being immersed into the saturated aqueous solution, the following pretreatment operations are performed on the high clay-bearing rock core sample:

performing an oil washing operation on the high clay-bearing rock core sample by using an organic solvent;

saturating the high clay-bearing rock core sample that has been subjected to the oil washing operation with brine.

The embodiment of the invention further provides a computer readable storage medium including computer readable instructions, when being executed, the computer readable instructions cause a processor to execute at least the following operations:

acquiring a saturated sample nuclear magnetic resonance (NMR) $T_2$ spectrum of a high clay-bearing rock core sample, wherein the saturated sample NMR $T_2$ spectrum is measured when a temperature of saturated aqueous solution reaches a preset temperature after the high clay-bearing rock core sample saturated with water being immersed into the saturated aqueous solution and then being placed and heated in a constant temperature and humidity environment;

determining a nuclear magnetic total porosity of the high clay-bearing rock core sample according to the saturated sample NMR $T_2$ spectrum;

acquiring a permeability and an NMR $T_2$ spectrum of the high clay-bearing rock core sample that is placed in the constant temperature and humidity environment and dried until different time;

generating a cross-plot of a permeability and a nuclear magnetic porosity according to the permeability and the NMR $T_2$ spectrum at different time; determining, according to the cross-plot, a first porosity corresponding to that the permeability reaches a first inflection point and a second porosity corresponding to that the permeability reaches a second inflection point; and determining an effective porosity of the high clay-bearing rock core based on the first porosity, the second porosity, and the nuclear magnetic total porosity.

In an embodiment, said acquiring a permeability and an NMR $T_2$ spectrum of the high clay-bearing rock core sample that is placed in the constant temperature and humidity environment and dried until different time comprises:

acquiring, when a saturated rock core sample is placed in the constant temperature and humidity environment, a permeability and an NMR $T_2$ spectrum of the saturated rock core sample that are measured every 0.5 hours when the NMR $T_2$ spectrum reflects a movable fluid; and a permeability and a NMR $T_2$ spectrum of the saturated rock core sample that are measured every 1 hour when the NMR $T_2$ spectrum does not reflect a movable fluid and reflects a bound water.

In an embodiment, said determining an effective porosity of the high clay-bearing rock core based on the first porosity, the second porosity, and the nuclear magnetic total porosity comprises:

determining a movable fluid porosity according to the nuclear magnetic total porosity and the first porosity;

determining a bound fluid porosity according to the first porosity and the second porosity; and determining the effective porosity of the high clay-bearing rock core according to the movable fluid porosity and the bound fluid porosity.

In an embodiment, the saturated sample NMR $T_2$ spectrum may be measured when a temperature of a saturated brine solution reaches any temperature between 55° C. and 65° C. after the high clay-bearing rock core sample being immersed into the saturated brine solution and then being placed and heated in the constant temperature and humidity environment.

In an embodiment, the saturated sample NMR $T_2$ spectrum is measured when a temperature of a saturated brine solution reaches 60° C. after the high clay-bearing rock core sample being immersed into the saturated brine solution and then being placed and heated in the constant temperature and humidity environment.

In an embodiment, the high clay-bearing rock core sample is a plunger core sample having a diameter ranging from 25 mm to 26 mm; and an included angle between an end face and an axial face of the high clay-bearing rock core sample ranges from 88 degrees to 92 degrees.

The advantageous technical effects of the technical solution provided by the implementations of the present invention are as follows:

In comparison with the solution in the existing methods for determining an effective porosity of a high clay-bearing rock core that, due to influence of uncertain factors such as temperature, humidity and time and etc., these methods lead to clay adsorbed water loss, thereby resulting in relatively large measurement results of the effective porosity, the technical solution provided in the embodiments of the present invention achieves that: the first porosity and the second porosity can be determined based on the permeability and the NMR $T_2$ spectrum at different time under a constant temperature and humidity condition, wherein the first porosity and the second porosity are porosities before the clay adsorbed water is lost; and the effective porosity of the high clay-bearing rock core is determined as an effective porosity without loss of the clay adsorbed water, based on the first porosity, the second porosity and the nuclear magnetic total porosity, thereby improving the accuracy of determining the effective porosity of the highly clay-bearing rock core.

Persons skilled in the art understand that, the embodiments of the present invention can be provided as a method, a system or a computer program product. Therefore, the present invention can adopt the forms of a full hardware example, a full software example, or combination of a software example and a hardware example. Moreover, the present invention can adopt the form of a computer program product that is implemented on one or more computer-usable storage medium (including but not limited to a disk memory, a CD-ROM, an optical memory, and etc.) including computer-usable program codes.

The invention is described with reference to flow diagrams and/or block diagrams of the method, the device (system) and the computer program product according to the embodiment of the invention. It should be understood that each flow and/or block in the flow diagrams and/or block diagrams, and the combination of the flows and/or blocks in the flow diagrams and/or block diagrams can be achieved by computer program instructions. These computer program instructions can be provided to a CPU of a general-purpose computer, a special-purpose computer, an embedded processor or other programmable data processing device to produce a machine, so that a device for achieving functions designated in one or more flows in the flow diagrams and/or one or more blocks in the block diagrams can be generated by the instruction executed by the CPU of the computer or other programmable data processing device.

These computer program instructions can also be stored in a computer-readable memory that can guide a computer or other programmable data processing device to operate in a special way, so that the instruction stored in the computer-readable memory generates a manufactured product including a instruction device which achieves functions designated in one or more flows in the flow diagrams and/or one or more blocks in the block diagrams.

These computer program instructions can also be loaded on a computer or other programmable data processing device, on which a series of operation steps are executed to generate processing achieved by the computer, so that the instruction executed on the computer or other programmable data processing device is provided for being used in the steps of achieving functions designated in one or more flows in the flow diagrams and/or one or more blocks in the block diagrams.

The foregoing is merely preferred embodiments of the present invention and is not intended to limit the present invention, and various modifications and variations can be made to the embodiments of the present invention by those skilled in the art. Any modifications, equivalents, improvements, etc. made within the spirit and principle of the present invention are intended to be included within the protection scope of the present invention.

The invention claimed is:

1. A method for determining an effective porosity of a high clay-bearing rock core, wherein comprising:

acquiring a saturated sample nuclear magnetic resonance (NMR) $T_2$ spectrum of a high clay-bearing rock core sample, wherein the saturated sample NMR $T_2$ spectrum is measured when a temperature of saturated aqueous solution reaches a preset temperature after the high clay-bearing rock core sample saturated with water being immersed into the saturated aqueous solution and then being placed and heated in a constant temperature and humidity environment;

determining a nuclear magnetic total porosity of the high clay-bearing rock core sample according to the saturated sample NMR $T_2$ spectrum;

acquiring a permeability and an NMR $T_2$ spectrum of the high clay-bearing rock core sample that is placed in the constant temperature and humidity environment and dried until different time;

generating a cross-plot of a permeability and a nuclear magnetic porosity according to the permeability and the NMR $T_2$ spectrum at different time; determining, according to the cross-plot, a first porosity corresponding to that the permeability reaches a first inflection point and a second porosity corresponding to that the permeability reaches a second inflection point; and determining an effective porosity of the high clay-bearing rock core based on the first porosity, the second porosity, and the nuclear magnetic total porosity.

2. The method for determining an effective porosity of a high clay-bearing rock core according to claim 1, wherein said acquiring a permeability and an NMR $T_2$ spectrum of the high clay-bearing rock core sample that is placed in the constant temperature and humidity environment and dried until different time comprises:

acquiring, when a saturated rock core sample is placed in the constant temperature and humidity environment, a permeability and an NMR $T_2$ spectrum of the saturated rock core sample that are measured every 0.5 hours when the NMR $T_2$ spectrum reflects a movable fluid; and a permeability and a NMR $T_2$ spectrum of the saturated rock core sample that are measured every 1 hour when the NMR $T_2$ spectrum does not reflect a movable fluid and reflects a bound water.

3. The method for determining an effective porosity of a high clay-bearing rock core according to claim 1, wherein said determining an effective porosity of the high clay-bearing rock core based on the first porosity, the second porosity, and the nuclear magnetic total porosity comprises:

determining a movable fluid porosity according to the nuclear magnetic total porosity and the first porosity;

determining a bound fluid porosity according to the first porosity and the second porosity; and determining the effective porosity of the high clay-bearing rock core according to the movable fluid porosity and the bound fluid porosity.

4. The method for determining an effective porosity of a high clay-bearing rock core according to claim 1, wherein the saturated sample NMR $T_2$ spectrum is measured when a temperature of a saturated brine solution reaches any temperature between 55° C. and 65° C. after the high clay-bearing rock core sample being immersed into the saturated brine solution and then being placed and heated in the constant temperature and humidity environment.

5. The method for determining an effective porosity of a high clay-bearing rock core according to claim 4, wherein the saturated sample NMR $T_2$ spectrum is measured when a temperature of a saturated brine solution reaches 60° C. after the high clay-bearing rock core sample being immersed into the saturated brine solution and then being placed and heated in the constant temperature and humidity environment.

6. The method for determining an effective porosity of a high clay-bearing rock core according to claim 1, wherein the high clay-bearing rock core sample is a plunger core sample having a diameter ranging from 25 mm to 26 mm; and an included angle between an end face and an axial face of the high clay-bearing rock core sample ranges from 88 degrees to 92 degrees.

7. The method for determining an effective porosity of a high clay-bearing rock core according to claim 1, wherein before the high clay-bearing rock core sample being immersed into the saturated aqueous solution, the following pretreatment operations are performed on the high clay-bearing rock core sample:

performing an oil washing operation on the high clay-bearing rock core sample by using an organic solvent; and saturating the high clay-bearing rock core sample that has been subjected to the oil washing operation with brine.

8. A computer device, wherein comprising a processor and a memory including computer readable instructions, when being executed, the computer readable instruction causes the processor to execute the following operations:

acquiring a saturated sample nuclear magnetic resonance (NMR) $T_2$ spectrum of a high clay-bearing rock core sample, wherein the saturated sample NMR $T_2$ spectrum is measured when a temperature of saturated aqueous solution reaches a preset temperature after the high clay-bearing rock core sample saturated with water being immersed into the saturated aqueous solution and then being placed and heated in a constant temperature and humidity environment;

determining a nuclear magnetic total porosity of the high clay-bearing rock core sample according to the saturated sample NMR $T_2$ spectrum;

acquiring a permeability and an NMR $T_2$ spectrum of the high clay-bearing rock core sample that is placed in the constant temperature and humidity environment and dried until different time;

generating a cross-plot of a permeability and a nuclear magnetic porosity according to the permeability and the NMR $T_2$ spectrum at different time; determining, according to the cross-plot, a first porosity corresponding to that the permeability reaches a first inflection point and a second porosity corresponding to that the permeability reaches a second inflection point; and determining an effective porosity of the high clay-bearing rock core based on the first porosity, the second porosity, and the nuclear magnetic total porosity.

9. The computer device according to claim 8, wherein said acquiring a permeability and an NMR $T_2$ spectrum of the high clay-bearing rock core sample that is placed in the constant temperature and humidity environment and dried until different time comprises:

acquiring, when a saturated rock core sample is placed in the constant temperature and humidity environment, a permeability and an NMR $T_2$ spectrum of the saturated rock core sample that are measured every 0.5 hours when the NMR $T_2$ spectrum reflects a movable fluid; and a permeability and a NMR $T_2$ spectrum of the saturated rock core sample that are measured every 1 hour when the NMR $T_2$ spectrum does not reflect a movable fluid and reflects a bound water.

10. The computer device according to claim 8, wherein said determining an effective porosity of the high clay-bearing rock core based on the first porosity, the second porosity, and the nuclear magnetic total porosity comprises:
determining a movable fluid porosity according to the nuclear magnetic total porosity and the first porosity;
determining a bound fluid porosity according to the first porosity and the second porosity; and
determining the effective porosity of the high clay-bearing rock core according to the movable fluid porosity and the bound fluid porosity.

11. The computer device according to claim 8, wherein the saturated sample NMR $T_2$ spectrum is measured when a temperature of a saturated brine solution reaches any temperature between 55° C. and 65° C. after the high clay-bearing rock core sample being immersed into the saturated brine solution and then being placed and heated in the constant temperature and humidity environment.

12. The computer device according to claim 11, wherein the saturated sample NMR $T_2$ spectrum is measured when a temperature of a saturated brine solution reaches 60° C. after the high clay-bearing rock core sample being immersed into the saturated brine solution and then being placed and heated in the constant temperature and humidity environment.

13. The computer device according to claim 8, wherein the high clay-bearing rock core sample is a plunger core sample having a diameter ranging from 25 mm to 26 mm; and an included angle between an end face and an axial face of the high clay-bearing rock core sample ranges from 88 degrees to 92 degrees.

14. The computer device according to claim 8, wherein before the high clay-bearing rock core sample being immersed into the saturated aqueous solution, the following pretreatment operations are performed on the high clay-bearing rock core sample:
performing an oil washing operation on the high clay-bearing rock core sample by using an organic solvent; and
saturating the high clay-bearing rock core sample that has been subjected to the oil washing operation with brine.

15. A computer readable storage medium including computer readable instructions, wherein when being executed, the computer readable instructions cause a processor to execute at least the following operations:
acquiring a saturated sample nuclear magnetic resonance (NMR) $T_2$ spectrum of a high clay-bearing rock core sample, wherein the saturated sample NMR $T_2$ spectrum is measured when a temperature of saturated aqueous solution reaches a preset temperature after the high clay-bearing rock core sample saturated with water being immersed into the saturated aqueous solution and then being placed and heated in a constant temperature and humidity environment;
determining a nuclear magnetic total porosity of the high clay-bearing rock core sample according to the saturated sample NMR $T_2$ spectrum;
acquiring a permeability and an NMR $T_2$ spectrum of the high clay-bearing rock core sample that is placed in the constant temperature and humidity environment and dried until different time;
generating a cross-plot of a permeability and a nuclear magnetic porosity according to the permeability and the NMR $T_2$ spectrum at different time; determining, according to the cross-plot, a first porosity corresponding to that the permeability reaches a first inflection point and a second porosity corresponding to that the permeability reaches a second inflection point; and
determining an effective porosity of the high clay-bearing rock core based on the first porosity, the second porosity, and the nuclear magnetic total porosity.

16. The computer readable storage medium including computer readable instructions according to claim 15, wherein said acquiring a permeability and an NMR $T_2$ spectrum of the high clay-bearing rock core sample that is placed in the constant temperature and humidity environment and dried until different time comprises:
acquiring, when a saturated rock core sample is placed in the constant temperature and humidity environment, a permeability and an NMR $T_2$ spectrum of the saturated rock core sample that are measured every 0.5 hours when the NMR $T_2$ spectrum reflects a movable fluid; and a permeability and a NMR $T_2$ spectrum of the saturated rock core sample that are measured every 1 hour when the NMR $T_2$ spectrum does not reflect a movable fluid and reflects a bound water.

17. The computer readable storage medium including computer readable instructions according to claim 15, wherein said determining an effective porosity of the high clay-bearing rock core based on the first porosity, the second porosity, and the nuclear magnetic total porosity comprises:
determining a movable fluid porosity according to the nuclear magnetic total porosity and the first porosity;
determining a bound fluid porosity according to the first porosity and the second porosity; and
determining the effective porosity of the high clay-bearing rock core according to the movable fluid porosity and the bound fluid porosity.

18. The computer readable storage medium including computer readable instructions according to claim 15, wherein the saturated sample NMR $T_2$ spectrum is measured when a temperature of a saturated brine solution reaches any temperature between 55° C. and 65° C. after the high clay-bearing rock core sample being immersed into the saturated brine solution and then being placed and heated in the constant temperature and humidity environment.

19. The computer readable storage medium including computer readable instructions according to claim 18, wherein the saturated sample NMR $T_2$ spectrum is measured when a temperature of a saturated brine solution reaches 60° C. after the high clay-bearing rock core sample being immersed into the saturated brine solution and then being placed and heated in the constant temperature and humidity environment.

20. The computer readable storage medium including computer readable instructions according to claim 15, wherein the high clay-bearing rock core sample is a plunger core sample having a diameter ranging from 25 mm to 26 mm; and an included angle between an end face and an axial face of the high clay-bearing rock core sample ranges from 88 degrees to 92 degrees.

* * * * *